United States Patent
Kitayama et al.

(10) Patent No.: US 12,417,922 B2
(45) Date of Patent: Sep. 16, 2025

(54) SURFACE TREATMENT METHOD, DRY ETCHING METHOD, CLEANING METHOD, SEMICONDUCTOR DEVICE MANUFACTURING METHOD, AND ETCHING DEVICE

(71) Applicant: CENTRAL GLASS COMPANY, LIMITED, Yamaguchi (JP)

(72) Inventors: Hikaru Kitayama, Yamaguchi (JP); Kunihiro Yamauchi, Yamaguchi (JP); Akiou Kikuchi, Yamaguchi (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 0 days.

(21) Appl. No.: 18/286,306

(22) PCT Filed: Apr. 26, 2022

(86) PCT No.: PCT/JP2022/018850
§ 371 (c)(1),
(2) Date: Oct. 10, 2023

(87) PCT Pub. No.: WO2022/230862
PCT Pub. Date: Nov. 3, 2022

(65) Prior Publication Data
US 2024/0186147 A1    Jun. 6, 2024

(30) Foreign Application Priority Data
Apr. 28, 2021  (JP) ................ 2021-075900

(51) Int. Cl.
*H01L 21/3065* (2006.01)
*C09K 13/00* (2006.01)
*H01L 21/311* (2006.01)

(52) U.S. Cl.
CPC ........ *H01L 21/3065* (2013.01); *C09K 13/00* (2013.01); *H01L 21/31122* (2013.01)

(58) Field of Classification Search
None
See application file for complete search history.

(56) References Cited

U.S. PATENT DOCUMENTS 11,335,573 B2 *  5/2022  Yamauchi ......... H01L 21/32135
11,618,954 B2 *  4/2023  Takeda ............. H01L 21/31111
                                                        438/706
(Continued)

FOREIGN PATENT DOCUMENTS

EP    4 560 683     5/2025
JP    9-330916      12/1997
(Continued)

OTHER PUBLICATIONS

International Search Report issued Jun. 28, 2022 in corresponding International (PCT) Application No. PCT/JP2022/018850, with English translation.
(Continued)

*Primary Examiner* — Allan W. Olsen
(74) *Attorney, Agent, or Firm* — WENDEROTH, LIND & PONACK, L.L.P.

(57) ABSTRACT

The present disclosure aims to provide a surface treatment method using a gas composition capable of removing a metal nitride at low temperatures without using plasma. The present disclosure relates to a surface treatment method including bringing a β-diketone and $NO_2$ into contact with a surface of a workpiece.

15 Claims, 1 Drawing Sheet

(56) References Cited

U.S. PATENT DOCUMENTS

| | | |
|---|---|---|
| 2005/0142885 A1 | 6/2005 | Shinriki |
| 2012/0180811 A1 | 7/2012 | Gunji et al. |
| 2014/0352716 A1 | 12/2014 | Kikuchi et al. |
| 2015/0047680 A1 | 2/2015 | Umezaki et al. |
| 2015/0270140 A1 | 9/2015 | Gupta et al. |
| 2016/0111294 A1* | 4/2016 | Berry, III ............... H10D 30/43 438/712 |
| 2017/0032990 A1 | 2/2017 | Lin et al. |
| 2018/0211844 A1 | 7/2018 | Lin et al. |
| 2019/0348307 A1 | 11/2019 | Yamauchi et al. |
| 2020/0066541 A1* | 2/2020 | Yamauchi ........... H01L 21/3205 |
| 2020/0135455 A1 | 4/2020 | Nakatani et al. |
| 2021/0090912 A1 | 3/2021 | Shindo et al. |
| 2021/0287915 A1 | 9/2021 | Yao et al. |
| 2021/0358760 A1 | 11/2021 | Fujisaki et al. |
| 2022/0020598 A1 | 1/2022 | Nakatani et al. |
| 2022/0056593 A1 | 2/2022 | Takeda et al. |
| 2022/0415667 A1 | 12/2022 | Yamauchi et al. |
| 2024/0194490 A1 | 6/2024 | Yamauchi et al. |

FOREIGN PATENT DOCUMENTS

| | | |
|---|---|---|
| JP | 2004-91829 | 3/2004 |
| JP | 2005-101361 | 4/2005 |
| JP | 2006-80103 | 3/2006 |
| JP | 2012-1492823 | 8/2012 |
| JP | 2013-194307 | 9/2013 |
| JP | 2014-236096 | 12/2014 |
| JP | 2017-28198 | 2/2017 |
| JP | 2017-59824 | 3/2017 |
| JP | 2018-60854 | 4/2018 |
| JP | 2022-18973 | 1/2022 |
| TW | 201445634 | 12/2004 |
| TW | 202030793 | 8/2020 |
| WO | 2017/010194 | 1/2017 |
| WO | 2018/020822 | 2/2018 |
| WO | 2018/128079 | 7/2018 |
| WO | 2020/179449 | 9/2020 |
| WO | 2021/079624 | 4/2021 |
| WO | 2022/230859 | 11/2022 |
| WO | 2024/019025 | 1/2024 |

OTHER PUBLICATIONS

International Search Report issued Jun. 28, 2022 in corresponding International (PCT) Application No. PCT/JP2022/018847, with English translation.

U.S. Appl. No. 18/286,310, filed Oct. 10, 2023 in the name of Kunihiro Yamauchi et al.

Johnson et al., "Thermal atomic layer etching of crystalline aluminum nitride using sequential, self-limiting hydrogen fluoride and $Sn(acac)_2$ reactions and enhancement by $H_2$ and Ar plasmas", Journal of Vacuum Science Technology, vol. 34, No. 5, Sep./Oct. 2016, pp. 050603-1 to 050603-5.

* cited by examiner

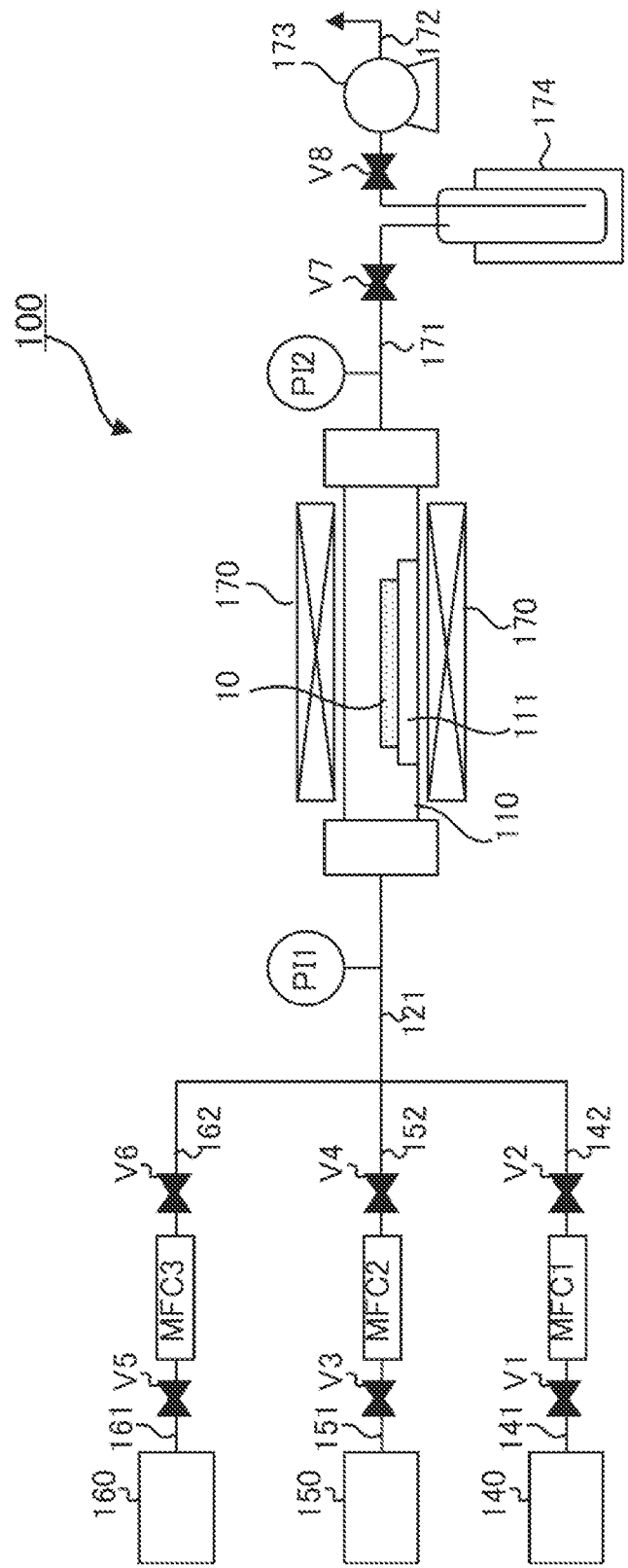

SURFACE TREATMENT METHOD, DRY ETCHING METHOD, CLEANING METHOD, SEMICONDUCTOR DEVICE MANUFACTURING METHOD, AND ETCHING DEVICE

TECHNICAL FIELD

The present disclosure relates to a surface treatment method, a dry etching method, a cleaning method, a semiconductor device production method, and an etching device.

BACKGROUND ART

GaN and AlGaN, which are group III-V compound semiconductors, have high electron mobility and high dielectric breakdown field strength and are thus expected to be applied to high electron mobility transistors (HEMTs). The production of a HEMT using GaN or the like requires etching of a part of GaN (recess etching). However, GaN is chemically very stable and is difficult to etch with chemicals at room temperature.

Patent Literature 1 discloses a method in which a nitride (e.g., AlGaN) semiconductor is subjected to plasma etching using HCl or $Cl_2$, resulting in the formation of an altered layer (a layer with compositional changes), which is then removed by an aqueous solution containing sulfuric acid, hydrofluoric acid, and ammonia.

Patent Literature 2 discloses a method that can etch a nitride (e.g., GaN)-based compound semiconductor with good controllability without accompanying compositional changes by treating it with HCl or $Cl_2$ at a high temperature of 400° C. or higher.

CITATION LIST

Patent Literature

Patent Literature 1: JP 2018-60854 A
Patent Literature 2: JP H9-33916 A

SUMMARY OF INVENTION

Technical Problem

As described above, while techniques for etching nitride semiconductors have been developed, improvements are desired with respect to the complicated steps and high etching temperatures.

The invention of Patent Literature 1 requires wet etching to remove an altered layer generated by plasma etching, which results in many steps. There is also room for consideration in terms of time and cost. Moreover, when plasma gas is brought into contact with a semiconductor device substrate, the substrate may be electrically damaged due to the plasma gas. Thus, there is a need for a method capable of plasmaless etching.

In the invention of Patent Literature 2, the etching temperature is as high as 400° C. or higher, which causes great damage to semiconductors. Thus, there is a need for a method which can etch nitride semiconductors at lower temperatures lower than 400° C., preferably lower than or equal to 350° C.

In view of the above problems, the present disclosure aims to provide a surface treatment method using a gas composition capable of removing a metal nitride at low temperatures without using plasma. The present disclosure also aims to provide a dry etching method, a cleaning method, etc., which include the surface treatment method.

Solution to Problem

As a result of extensive studies, the inventors of the present disclosure have found that use of a β-diketone and $NO_2$ makes it possible to remove nitrides such as GaN and AlGaN at low temperatures and at high rates. This finding has led to the completion of the present disclosure.

Specifically, a surface treatment method according to the present disclosure includes bringing a β-diketone and $NO_2$ into contact with a surface of a workpiece.

A dry etching method according to the present disclosure includes bringing a β-diketone and $NO_2$ into contact with an etching target film for etching in a non-plasma state, the etching target film being formed on a surface of a workpiece and containing a nitride of a metal.

A cleaning method according to the present disclosure includes bringing a β-diketone and $NO_2$ into contact with a deposit in a processing vessel of a substrate processing device, deposited on a surface of the processing vessel, to remove the deposit.

A semiconductor device production method according to the present disclosure includes allowing an etching target film containing a nitride of a metal on a substrate to react with a β-diketone and $NO_2$ for etching in a non-plasma state.

An etching device according to the present disclosure includes: a placement unit provided in a heatable processing vessel, for placing a workpiece on a surface of which an etching target film containing a nitride of a metal is formed; a β-diketone supply unit for supplying a β-diketone into the processing vessel; and a $NO_2$ supply unit for supplying $NO_2$ into the processing vessel.

Advantageous Effects of Invention

The present disclosure can provide a surface treatment method using a gas composition capable of removing a metal nitride film at low temperatures without using plasma.

BRIEF DESCRIPTION OF DRAWINGS

FIG. 1 is a schematic view schematically showing an etching device according to an embodiment of the present disclosure.

DESCRIPTION OF EMBODIMENTS

Hereinafter, embodiments of the present disclosure are described specifically.

However, the present disclosure is not limited to the following embodiments, which can be modified and applied as appropriate without changing the gist of the present disclosure.

[Surface Treatment Method]

The surface treatment method of the present disclosure includes bringing a β-diketone and $NO_2$ into contact with a surface of a workpiece.

Although the mechanism of the technique for etching a nitride of a group 13 metal using a β-diketone such as HFAc is unclear, it is believed that an additive gas may be used to form an oxide layer on the surface of the nitride, and then the oxide layer is allowed to react with the β-diketone and thereby etched. Thus, it is considered that oxidizing the nitride allows etching to proceed. However, as a result of the experiments tried by the inventors of the present disclosure, there was a problem in that when $O_2$ capable of forming an oxide layer was used in combination with a β-diketone, etching was accompanied by a decrease in the N content of the etching target film. As a result of further extensive studies on etching methods which cause no compositional changes before and after etching, the inventors have found an etching technique using a β-diketone and $NO_2$.

The surface treatment method of the present disclosure is suitable as a method for removing a material present on the surface of a workpiece from the surface of the workpiece.

The material is preferably a nitride of a metal. The nitride of the metal is desirably a nitride of a group 13 metal. More desirably, the nitride of the metal is at least one selected from the group consisting of nitrides of Al (aluminum), Ga (gallium), In (indium), and Tl (thallium) (i.e., aluminum nitrides, gallium nitrides, indium nitrides, and thallium nitrides). The material may be any of the nitrides of metals mentioned above, or may be an alloy containing two or more of the nitrides of metals mentioned above or a nitride of the alloy. Further desirably, the group 13 metal is at least one selected from the group consisting of Al, Ga, and In. Specific examples of the material include GaN, AlGaN, InN, InGaN, AlN, and InAlN.

Any type of β-diketone may be used. Examples include hexafluoroacetylacetone (HFAc, 1,1,1,5,5,5-hexafluoro-2,4-pentanedione), trifluoroacetylacetone (1,1,1-trifluoro-2,4-pentanedione), and acetylacetone (2,4-pentanedione). The β-diketone used may be a single compound or two or more compounds.

The β-diketone and $NO_2$ may be brought into contact with the surface of the workpiece simultaneously or separately.

Although the surface treatment method of the present disclosure uses a β-diketone and $NO_2$, it may further use at least one additive gas selected from the group consisting of $O_2$, NO, CO, $CO_2$, $H_2O$, $H_2O_2$, and alcohols. Examples of combinations of the β-diketone, $NO_2$, and additive gas that may be used in the surface treatment method of the present disclosure include a combination of the β-diketone, $NO_2$, and NO, and a combination of the β-diketone, $NO_2$, NO, and $O_2$.

The surface treatment method of the present disclosure may further use at least one inert gas selected from the group consisting of $N_2$, Ar, He, Ne, and Kr, in addition to the β-diketone and $NO_2$. Moreover, examples of alcohols that can be used include methanol, ethanol, propanol, and isopropyl alcohol.

Examples of the workpiece include semiconductor device substrates and processing vessels of substrate processing devices. For example, when the workpiece is a semiconductor device substrate, the material present on the surface of the workpiece may be an etching target film or the like. For example, when the workpiece is a processing vessel of a substrate processing device, the material present on the surface of the workpiece may be a deposit that has been deposited on the inner surface of the processing vessel by etching of an etching target film, or the like.

In the surface treatment method of the present disclosure, the β-diketone and $NO_2$ in a plasma state may be brought into contact with the surface of the workpiece, or the β-diketone and $NO_2$ in a non-plasma state may be brought into contact with the surface of the workpiece. However, preferably, the β-diketone and $NO_2$ are brought into contact with the surface of the workpiece in a non-plasma state, because when the semiconductor device substrate used as the workpiece is brought into contact with the plasma gas, the substrate may be electrically damaged due to the plasma gas.

The workpiece may have any surface temperature when the β-diketone and $NO_2$ are brought into contact with the surface of the workpiece. For example, the surface temperature is 250° C. or higher and 400° C. lower. The temperature of the workpiece is substantially equal to the temperature of the material present on the surface of the workpiece. Bringing the β-diketone and $NO_2$ into contact with the material in a heated state causes a reaction of the gases with the nitride of the metal, forming a complex on the surface of the material. This complex, which has a high vapor pressure, can remove the material as the complex evaporates.

[Dry Etching Method]

The surface treatment method of the present disclosure described above can be used as a dry etching method for forming a predetermined pattern on a GaN film or the like formed on the surface of a workpiece.

The dry etching method of the present disclosure includes bringing a β-diketone and $NO_2$ into contact with an etching target film for etching in a non-plasma state, the etching target film being formed on a surface of a workpiece and containing a nitride of a metal.

The nitride of the metal contained in the etching target film may be as described above for the surface treatment method. The etching target film may be a nitride film containing one of the group 13 metals described above or may be a nitride film of an alloy containing two or more of the group 13 metals described above.

The etching target film is desirably a nitride of at least one group 13 metal selected from the group consisting of Ga, Al, and In. Desirably, the etching target film is at least one film selected from the group consisting of gallium nitride films, aluminum nitride films, indium nitride films, aluminum gallium nitride films, and indium gallium nitride films.

The dry etching method of the present disclosure can provide a dry etching method that can etch a hard-to-etch etching target film containing a nitride of a metal in a non-plasma state at a temperature of 400° C. or lower or even 350° C. or lower.

Since hexafluoroacetylacetone (hereinafter also referred to as HFAc), which is a type of β-diketone, has a decomposition temperature of 375° C., an etching temperature higher than 400° C. is very likely to cause decomposition of HFAc, so that the carbon components may be deposited on the etching target film to be etched, causing inconvenience in the subsequent process.

In contrast, the dry etching method of the present disclosure uses a β-diketone and $NO_2$ and thus can lower the etching temperature to 350° C. or lower, thereby reducing the formation of a carbon film due to decomposition of the β-diketone.

In the dry etching method of the present disclosure, examples of the workpiece include silicon substrates, compound semiconductor substrates, quartz substrates, and glass substrates. In addition to the etching target film containing the nitride of the metal, a silicon film, a silicon oxide film, a silicon nitride film, a metal wiring film made of a metal other than the metal, or the like may be formed on the surface of the workpiece. For example, the workpiece may be placed in a placement unit of an etching device as described later, and the placement unit may be heated to heat the workpiece and the etching target film containing the nitride of the metal formed on the surface of the workpiece.

The etching target film may be formed on the surface of the workpiece by any method. Examples include chemical vapor deposition (CVD) and sputtering. Moreover, the etching target film containing the nitride of the metal may have any thickness, such as a thickness of 0.1 nm or more and 1 μm or less.

[First Dry Etching Method]

As the dry etching method of the present disclosure, first, a description is given on a first dry etching method including bringing an etching gas A containing the β-diketone and $NO_2$ into contact with the etching target film.

The temperature of the workpiece is substantially equal to the temperature of the etching target film. Bringing the etching gas A containing the β-diketone and $NO_2$ into contact with the etching target film in a heated state causes a reaction of the β-diketone and $NO_2$ with the nitride of the metal, forming a complex on the etching target film. This complex, which has a high vapor pressure, can etch the etching target film as the complex evaporates.

The β-diketone contained in the etching gas A may be as described for the β-diketone used in the surface treatment method described above.

The volume ratio of the β-diketone to the $NO_2$ in the etching gas A is preferably β-diketone:$NO_2$=10:0.1 to 100, more preferably β-diketone:$NO_2$=10:0.01 to 10, still more preferably β-diketone:$NO_2$=10:0.1 to 10. Too low a proportion of the β-diketone in the etching gas A tends to lead to a reduced etching rate, whereas too high a proportion thereof makes the etching gas too expensive. Moreover, either too little or too much of $NO_2$ in the etching gas can inhibit the progress of etching.

Although the etching gas A may consist of the β-diketone and $NO_2$, it may further contain at least one additive gas selected from the group consisting of $O_2$, NO, $N_2O$, CO, $CO_2$, $H_2O$, $H_2O_2$, and alcohols, or may further contain at least one inert gas selected from the group consisting of $N_2$, Ar, He, Ne, and Kr. Moreover, examples of the alcohols that can be used include methanol, ethanol, propanol, and isopropyl alcohol.

When an additive gas is used, the total additive gas content may be 10 vol % or more and 90 vol % or less relative to the total of the β-diketone, $NO_2$, the additive gas, and the inert gas taken as 100 vol %.

When the etching gas A contains an inert gas, the inert gas content in the etching gas A is preferably 1 vol % or more and 90 vol % or less, more preferably 10 vol, or more and 80 vol % or less, still more preferably 30 vol % or more and 50 vol % or less.

[Second Dry Etching Method]

Next, as the dry etching method of the present disclosure, a description is given on a second dry etching method including a first etching step including bringing an etching gas B containing $NO_2$ into contact with the etching target film, and a second etching step including bringing an etching gas C containing the δ-diketone into contact with the etching target film.

In the second dry etching method of the present disclosure, examples of the workpiece include silicon substrates, compound semiconductor substrates, quartz substrates, and glass substrates, as in the case of the first dry etching method. In addition to the nitride film of the metal described above, a silicon film, a silicon oxide film, a silicon nitride film, a metal wiring film made of a metal other than the metal, or the like may be formed on the surface of the workpiece. The workpiece may be placed in a placement unit, and the placement unit may be heated to heat the workpiece and the etching target film containing the nitride of the metal formed on the surface of the workpiece.

The temperature of the workpiece is substantially equal to the temperature of the etching target film. As the first etching step, bringing the etching gas B containing $NO_2$ into contact with the etching target film in a heated state allows the $NO_2$ to adsorb onto the surface of the etching target film. Subsequently, as the second etching step, bringing the etching gas C containing the β-diketone into contact with the etching target film causes a reaction between the nitride of the metal with $NO_2$ adsorbed thereon and the β-diketone, forming a complex on the etching target film as in the first dry etching method. This complex, which has a high vapor pressure, can etch the etching target film containing the nitride of the metal as the complex evaporates.

In the second dry etching method of the present disclosure, the above steps may be repeated multiple times to repeatedly etch the etching target film. The etching target film can be etched to a certain thickness in one etching cycle, and thus a layer with a precisely desired thickness can be etched by specifying the number of cycles.

The β-diketone used may be as described above for the surface treatment method.

Although the etching gas C may consist of the β-diketone, and the etching gas B may consist of $NO_2$, the etching gas B and the etching gas C may each further contain at least one additive gas selected from the group consisting of $O_2$, NO, $N_2O$, CO, $CO_2$, $H_2O$, $H_2O_2$, and alcohols. The etching gas B and the etching gas C may each further contain at least one inert gas selected from the group consisting of $N_2$, Ar, He, Ne, and Kr. Moreover, examples of the alcohols that can be used include methanol, ethanol, propanol, and isopropyl alcohol.

When the etching gas B contains an additive gas, the total additive gas content in the etching gas B may be 10 vol % or more and 90 vol % or less relative to the total of $NO_2$, the additive gas, and the inert gas taken as 100 vol %.

Also, when the etching gas C contains an additive gas, the total additive gas content in the etching gas C may be 10 vol % or more and 90 vol % or less relative to the total of $NO_2$, the additive gas, and the inert gas taken as 100 vol %.

When the etching gas B or the etching gas C contains an inert gas, the inert gas content in the etching gas B or the etching gas C is preferably 1 vol % or more and 90 vol % or less, more preferably 10 vol % or more and 80 vol % or less, still more preferably 30 vol % or more and 50 vol % or less.

[Etching Device]

The dry etching method of the present disclosure can be accomplished, for example, using an etching device as described below. Such an etching device is also encompassed by the present disclosure.

The etching device of the present disclosure includes: a placement unit disposed in a heatable processing vessel, for placing a workpiece on a surface of which an etching target film containing a nitride of a metal is formed; a β-diketone supply unit for supplying a β-diketone into the processing vessel; and a $NO_2$ supply unit for supplying a $NO_2$ gas into the processing vessel. The etching device of the present disclosure may further include an inert gas supply unit for supplying an inert gas into the processing vessel.

FIG. 1 is a schematic view schematically showing an etching device according to an embodiment of the present disclosure.

The etching device 100 shown in FIG. 1 includes: a processing vessel 110 for placing a workpiece 10 on a surface of which a nitride of a metal is formed; a β-diketone supply unit 140 that is connected to the processing vessel 110 to supply a gaseous β-diketone; a $NO_2$ gas supply unit 150 for supplying gaseous $NO_2$; an inert gas supply unit 160 for supplying an inert gas; and a heating means 170 for heating the processing vessel 110. It should be noted that the etching device 100 may not include the inert gas supply unit 160.

The etching device 100 further includes a control unit that is not shown in the FIGURE. For example, the control unit constitutes a computer and includes a program, a memory, and a CPU. In the program, a group of steps is incorporated to implement a series of operations in the first etching method or the second etching method. In accordance with the program, operations may be performed such as adjusting the temperature of the workpiece 10, opening or closing the valves of the supply units, adjusting the flow rates of the gases, adjusting the pressure in the processing vessel 110, etc. This program is stored in a computer storage medium such as a compact disk, a hard disk, a magneto-optical disk, or a memory card, and installed in the control unit.

The processing vessel 110 is provided with a placement unit 111 for placing the workpiece 10. The processing vessel 110 is not limited as long as it is resistant to the β-diketone used and depressurizable to a predetermined pressure. Usually, a general processing vessel or the like provided in a semiconductor etching device may be used. The supply pipes for supplying the etching gases and other pipes, etc. are also not limited as long as they are resistant to the β-diketone. Any general pipes may be used.

The β-diketone supply unit 140 controls the amount of supply using valves V1 and V2 and a mass flow controller MFC1 to supply a β-diketone through pipes 141 and 142 to a pipe 121.

The $NO_2$ gas supply unit 150 controls the amount of supply using valves V3 and V4 and a mass flow controller MFC2 to supply $NO_2$ through pipes 151 and 152 to the pipe 121.

The inert gas supply unit 160 controls the amount of supply using valves V5 and V6 and a mass flow controller MFC3 to supply an inert gas through pipes 161 and 162 to the pipe 121.

The heating means 170 for heating the processing vessel 110 is disposed outside the processing vessel 110. A heater (not shown) may also be provided as a second heating means inside the placement unit 111. Here, when a plurality of placement units are provided in the processing vessel 110, each placement unit may be provided with a heater so that the temperature of the workpiece on each placement unit can be individually set to a predetermined temperature.

A gas discharge means for discharging the reacted gases is disposed on one side of the processing vessel 110. The reacted gases are discharged from the processing vessel 110 through a pipe 171 by a vacuum pump 173 of the gas discharge means. The reacted gases are collected by a liquid nitrogen trap 174 disposed between the pipe 171 and a pipe 172. Valves V7 and V8 may be disposed in the pipes 171 and 172, respectively, to control the pressure. Moreover, in FIG. 1, the reference signs PI1 and PI2 each indicate a pressure gauge, and the control unit can control the mass flow controllers and the valves according to the pressure gauge readings.

An etching method is specifically described using the etching device 100 as an example.

[First Dry Etching Method Using Above Etching Device]

The first dry etching method of the present disclosure includes bringing an etching gas A containing a β-diketone and $NO_2$ into contact with an etching target film.

In the first dry etching method, first, a workpiece 10 on which an etching target film containing a nitride of a metal is formed is placed in the processing vessel 110. Next, the vacuum pump 173 is used to evacuate, to a predetermined pressure, the inside of the processing vessel 110, the pipe 121, the pipes 141 and 142, the pipes 151 and 152, the pipes 161 and 162, the liquid nitrogen trap 174, and the pipes 171 and 172. Subsequently, the workpiece 10 is heated by the heating means 170.

Once the workpiece 10 reaches a predetermined temperature, a β-diketone and a $NO_2$ gas are supplied from the β-diketone supply unit 140 and the $NO_2$ gas supply unit 150, respectively, to the pipe 121 at respective predetermined flow rates. Here, an inert gas may be supplied from the inert gas supply unit 160 to the pipe 121 at a predetermined flow rate.

The β-diketone and $NO_2$ are mixed in predetermined proportions and supplied to the processing vessel 110. The pressure in the processing vessel 110 is controlled to a predetermined pressure while introducing the mixed etching gas into the processing vessel 110. Etching is performed by allowing the etching gas to react with the etching target film containing the nitride of the metal for a predetermined period of time to form a complex. This etching method enables plasmaless etching in a non-plasma state and eliminates the need to excite the etching gas by plasma or the like during etching. The flow rate of the etching gas may be appropriately set according to the capacity, pressure, and other conditions of the processing vessel.

It should be noted that etching in a plasma state refers to a process in which a gas or the like at a pressure of about 0.01 to 1.33 kPa, for example, is introduced into a reactor, and a high-frequency power is applied to an outer coil or a counter electrode to generate low-temperature gas plasma in the reactor, followed by etching with the active chemical species such as ions or radicals formed in the plasma.

The dry etching method of the present disclosure brings a gas into contact with a target in a non-plasma state to perform dry etching without generating the gas plasma described above.

After completion of the etching step, heating with the heating means 170 is stopped to lower the temperature, and the vacuum pump 173 is also stopped, followed by purging with an inert gas to release the vacuum. As described above, the first dry etching method using the etching device described above can etch an etching target film containing a nitride of a metal.

(Etching Conditions in First Dry Etching Method)

In the first dry etching method of the present disclosure, the temperature of the etching target film when the etching gas A is brought into contact with the etching target film may be any temperature that allows the complex to vaporize. In particular, the temperature of the etching target film to be removed is preferably 250° C. or higher and 400° C. or lower, more preferably 275° C. or higher and 375° C. or lower, further preferably 275° C. or higher and 350° C. or lower, further preferably 300° C. or higher and 350° C. or lower.

Moreover, when the etching gas A is brought into contact with the etching target film, the pressure in the processing vessel in which the workpiece with the etching target film formed thereon is placed is not limited, but it is usually in a pressure range of 0.1 kPa to 101.3 kPa.

To achieve a sufficient etching rate, the pressure in the processing vessel during the etching step is preferably 20 Torr or more and 300 Torr or less (2.67 kPa or more and 39.9 kPa or less), more preferably 20 Torr or more and 200 Torr or less (2.67 kPa or more and 26.7 kPa or less), still more preferably 20 Torr or more and 100 Torr or less (2.67 kPa or more and 13.3 kPa or less).

The processing time during the etching step is not limited, but it is preferably within 60 minutes, in view of the efficiency of the semiconductor device production process. Here, the processing time during the etching step refers to the time from when the etching gas is introduced into the processing vessel in which the workpiece has been provided until when the etching gas in the processing vessel is then discharged by a vacuum pump or the like to terminate the etching process.

[Second Dry Etching Method Using Above Etching Device]

The second dry etching method of the present disclosure includes: a first etching step including bringing an etching gas B containing $NO_2$ into contact with an etching target film; and a second etching step including bringing an etching gas C containing a β-diketone into contact with the etching target film.

In the second dry etching method, first, a workpiece 10 on which an etching target film containing a nitride of a metal is formed is placed in the processing vessel 110. Next, the vacuum pump 173 is used to evacuate, to a predetermined pressure, the inside of the processing vessel 110, the pipe 121, the pipes 141 and 142, the pipes 151 and 152, the pipes 161 and 162, the liquid nitrogen trap 174, and the pipes 171 and 172. Subsequently, the workpiece 10 is heated by the heating means 170.

Once the workpiece 10 reaches a predetermined temperature, first, a $NO_2$ gas is supplied from the $NO_2$ gas supply unit 150 to the pipe 121 at a predetermined flow rate. Here, an inert gas may be supplied from the inert gas supply unit 160 to the pipe 121 at a predetermined flow rate. The pressure in the processing vessel 110 is controlled to a predetermined pressure while introducing the $NO_2$ gas or both the $NO_2$ gas and the inert gas into the processing vessel 110. The $NO_2$ gas is introduced into the processing vessel 110 for a predetermined period of time to allow $NO_2$ to adsorb onto the etching target film.

After the gases including the $NO_2$ gas are evacuated, a β-diketone gas is supplied from the β-diketone supply unit 140 to the pipe 121 at a predetermined flow rate. Here, an inert gas may be supplied from the inert gas supply unit 160 to the pipe 121 at a predetermined flow rate. The pressure in the processing vessel 110 is controlled to a predetermined pressure while introducing the β-diketone gas or both the β-diketone gas and the inert gas into the processing vessel 110. The β-diketone gas is introduced into the processing vessel 110 for a predetermined period of time to cause a reaction between the $NO_2$ previously adsorbed onto the etching target film and the β-diketone, forming a complex, which may then react with the etching target film and etch the etching target film.

In the second dry etching method of the present disclosure, a cycle including the first etching step of introducing a $NO_2$ gas into the processing vessel 110 and the second etching step of introducing a β-diketone into the processing vessel 110 can be repeated multiple times.

In the second dry etching method of the present disclosure, the etching conditions in one cycle may be set to predetermined conditions to control the thickness of the etching target film that can be etched in one cycle. Thus, the etching thickness can be precisely controlled by setting the thickness of the etching target film that can be etched in one cycle to be thin.

It should be noted that the second dry etching method also enables plasmaless etching in a non-plasma state and eliminates the need to excite the etching gas by plasma or the like during etching. The flow rates of the $NO_2$ and β-diketone may be appropriately set according to the capacity, pressure, and other conditions of the processing vessel.

Thus, according to the second dry etching method of the present disclosure using the etching device described above, it is possible to bring gases into contact with a target in a non-plasma state to perform dry etching without generating the gas plasma described above.

After completion of the etching step, heating with the heating means 170 is stopped to lower the temperature, and the vacuum pump 173 is also stopped, followed by purging with an inert gas to release the vacuum. As described above, it is possible to etch an etching target film containing a nitride of a metal.

(Etching Conditions in Second Dry Etching Method)

In the second dry etching method of the present disclosure, the temperature of the etching target film during the first etching step and the second etching step may be any temperature that allows the complex to vaporize. In particular, the temperature of the etching target film to be removed is preferably 250° C. or higher and 400° C. or lower, more preferably 275° C. or higher and 375° C. or lower, further preferably 275° C. or higher and 350° C. or lower, further preferably 300° C. or higher and 350° C. or lower. Desirably, the temperature of the etching target film is the same in the first etching step and the second etching step.

Moreover, the pressure in the processing vessel in the first etching step and the second etching step is not limited, but it is usually in a pressure range of 0.1 kPa to 101.3 kPa.

To achieve a sufficient etching rate, the pressure in the processing vessel in the first etching step and the second etching step is preferably 20 Torr or more and 300 Torr or less (2.67 kPa or more and 39.9 kPa or less), more preferably 20 Torr or more and 200 Torr or less (2.67 kPa or more and 26.7 kPa or less), still more preferably 20 Torr or more and 100 Torr or less (2.67 kPa or more and 13.3 kPa or less). Desirably, the pressure in the processing vessel in the second etching step is higher than the pressure in the processing vessel in the first etching step.

The processing time in the first etching step and the second etching step is not limited, but the processing time in one cycle of the first etching step is preferably within 60 minutes, and the processing time in one cycle of the second etching step is preferably within 60 minutes. Here, the processing time during each etching step refers to the time from when the etching gas is introduced into the processing vessel in which the workpiece has been provided until when the etching gas in the processing vessel is then discharged by a vacuum pump or the like to terminate the etching process.

[Semiconductor Device Production Method]

The dry etching method of the present disclosure described above can be used as an etching method for forming a predetermined pattern on a gallium nitride film or an aluminum gallium nitride film in a semiconductor device. Etching a gallium nitride film, an aluminum gallium nitride film, or the like on a substrate by the dry etching method of the present disclosure enables low cost production of semiconductor devices.

The semiconductor device production method of the present disclosure includes allowing an etching target film containing a nitride of a metal on a substrate to react with a β-diketone and $NO_2$ for etching in a non-plasma state.

The step of allowing the etching target film to react with a β-diketone and $NO_2$ for etching in a non-plasma state can be performed by the dry etching method of the present disclosure described above.

[Cleaning Method]

The surface treatment method of the present disclosure described above can be used as a cleaning method for removing a deposit in a processing vessel of a substrate processing device, deposited on the surface of the processing vessel. Removing the deposit in the processing vessel using the cleaning method of the present disclosure allows for removal of even a material having high chemical stability, such as gallium nitride or aluminum gallium nitride.

The cleaning method of the present disclosure includes bringing a β-diketone and $NO_2$ into contact with a deposit in a processing vessel of a substrate processing device, deposited on a surface of the processing vessel, to remove the deposit.

The conditions and procedure for bringing a β-diketone and $NO_2$ into contact with a deposit in a processing vessel of a substrate processing device, deposited on a surface of the processing vessel, and the deposit are the same as the conditions and procedure for bringing a β-diketone and $NO_2$ into contact with a surface of a workpiece, and the material formed on the surface of the workpiece in the surface treatment method described above.

In the cleaning method of the present disclosure, the β-diketone and $NO_2$ in a plasma state may be brought into contact with the deposit, or the β-diketone and $NO_2$ in a non-plasma state may be brought into contact with the deposit. The deposit may have any temperature when the β-diketone and $NO_2$ are brought into contact therewith. For example, the temperature is 250° C. or higher and 400° C. or lower.

(1) A surface treatment method, including: bringing a β-diketone and $NO_2$ into contact with a surface of a workpiece.

(2) The surface treatment method according to (1) above, wherein the β-diketone and $NO_2$ are brought into contact with the surface of the workpiece in a non-plasma state.

(3) The surface treatment method according to (1) or (2) above, wherein the β-diketone and $NO_2$ are brought into contact with a nitride of a metal present on the surface of the workpiece.

(4) The surface treatment method according to (3) above, wherein the nitride of the metal is a nitride of a group 13 metal.

(5) The surface treatment method according to (4) above, wherein the group 13 metal is at least one selected from the group consisting of Al, Ga, and In.

(6) A dry etching method, including: bringing a β-diketone and $NO_2$ into contact with an etching target film for etching in a non-plasma state, the etching target film being formed on a surface of a workpiece and containing a nitride of a metal.

(7) The dry etching method according to (6) above, wherein the etching target film is a nitride film of at least one group 13 metal selected from the group consisting of Ga, Al, and In.

(8) The dry etching method according to (6) or (7) above, wherein the β-diketone is at least one compound selected from the group consisting of hexafluoroacetylacetone, trifluoroacetylacetone, and acetylacetone.

(9) The dry etching method according to any one of (6) to (8) above, wherein an etching gas A containing the β-diketone and $NO_2$ is brought into contact with the etching target film.

(10) The dry etching method according to (9) above, wherein a temperature of the etching target film is 250° C. or higher and 400° C. or lower when the etching gas A is brought into contact with the etching target film.

(11) The dry etching method according to (9) or (10) above, wherein a volume ratio of the β-diketone to the $NO_2$ in the etching gas A is β-diketone:$NO_2$=10:0.1 to 100.

(12) The dry etching method according to any one of (9) to (11) above, wherein a volume ratio of the β-diketone to the $NO_2$ in the etching gas A is β-diketone:$NO_2$=10:0.01 to 10.

(13) The dry etching method according to any one of (9) to (12) above, wherein a pressure in a processing vessel in which the workpiece with the etching target film formed thereon is placed is in a pressure range of 0.1 kPa to 101.3 kPa when the etching gas A is brought into contact with the etching target film.

(14) The dry etching method according to any one of (9) to (13) above, wherein the etching gas A further contains at least one inert gas selected from the group consisting of $N_2$, Ar, He, Ne, and Kr.

(15) The dry etching method according to any one of (6) to (8) above, including a first etching step including bringing an etching gas B containing the $NO_2$ into contact with the etching target film, and a second etching step including bringing an etching gas C containing the β-diketone into contact with the etching target film.

(16) The dry etching method according to (15) above, wherein the first etching step and the second etching step are repeated.

(17) The dry etching method according to (15) or (16) above, wherein a temperature of the etching target film is 250° C. or higher and 400° C. or lower when the etching gas B is brought into contact with the etching target film and when the etching gas C is brought into contact with the etching target film.

(18) The dry etching method according to any one of (15) to (17) above, wherein a pressure in a processing vessel in which the workpiece with the etching target film formed thereon is placed is in a pressure range of 0.1 kPa to 101.3 kPa when the etching gas B is brought into contact with the etching target film and when the etching gas C is brought into contact with the etching target film.

(19) The dry etching method according to any one of (15) to (18) above, wherein the etching gas B and the etching gas C each further contain at least one inert gas selected from the group consisting of $N_2$, Ar, He, Ne, and Kr.

(20) A cleaning method, including: bringing a β-diketone and $NO_2$ into contact with a deposit in a processing vessel of a substrate processing device, deposited on a surface of the processing vessel, to remove the deposit.

(21) The cleaning method according to (20) above, wherein the deposit is a nitride of a metal.

(22) The cleaning method according to (20) or (21) above, wherein the nitride of the metal is a nitride of a group 13 metal.

(23) The cleaning method according to (22) above, wherein the group 13 metal is at least one selected from the group consisting of Al, Ga, and In.

(24) A semiconductor device production method, including: allowing an etching target film containing a nitride of a metal on a substrate to react with a β-diketone and $NO_2$ for etching in a non-plasma state.

(25) An etching device, including: a placement unit provided in a heatable processing vessel, for placing a workpiece on a surface of which an etching target film containing a nitride of a metal is formed; a β-diketone supply unit for supplying a β-diketone into the processing vessel; and a $NO_2$ supply unit for supplying $NO_2$ into the processing vessel.

(26) The etching device according to (25) above, further including an inert gas supply unit for supplying an inert gas into the processing vessel.

EXAMPLES

Hereinafter, examples that specifically disclose the present disclosure are described. It should be noted that the present disclosure is not limited to these examples.

Example 1

The etching device 100 shown in FIG. 1 was used to etch a workpiece 10 including a sapphire wafer (shape: 1 cm×1 cm; thickness: 650 μm) and an etching target film made of a gallium nitride (GaN) film (shape: 1 cm×1 cm; film thickness: 3.4 μm) formed on the surface of the sapphire wafer.

As the operation of Example 1, a description is given on a first dry etching method including bringing an etching gas containing the β-diketone and $NO_2$ into contact with the etching target film. The inside of the processing vessel 110, the pipes 121 and 171, the pipe 142, the pipe 152, the pipe 162, and the liquid nitrogen trap 174 was evacuated to lower than 10 Pa. Subsequently, the workpiece 10 placed in the placement unit 111 was heated by the heating means 170 and a heater disposed within the placement unit 111. After confirming that the temperature of the workpiece 10 had reached 350° C., gaseous hexafluoroacetylacetone (HFAc) from the β-diketone supply unit 140 and a $NO_2$ gas from the $NO_2$ gas supply unit 150 were supplied to the pipes 142 and 152, respectively, at respective predetermined flow rates to introduce the etching gases into the processing vessel 110 while controlling the pressure inside the processing vessel 110 to 12.0 kPa, whereby an etching step was performed. The temperature of the workpiece was set to 350° C., and the etching gas flow rates were set as follows: HFAc=10 sccm, and $NO_2$=5 sccm. After thirty minutes had elapsed since the introduction of the etching gases started, the introduction of the etching gases was stopped.

Subsequently, the inside of the processing vessel 110 was evacuated to lower than 10 Pa and purged with a $N_2$ gas supplied from the inert gas supply unit 160. The workpiece 10 was then taken out, and the amount of etching and the compositional ratio were measured. The compositional ratio was measured by X-ray photoelectron spectroscopy (XPS). Table 1 shows the results.

It should be noted that in Examples 1 and 2 including the following Example 2, the first dry etching method was used which includes bringing an etching gas A containing a β-diketone and $NO_2$ into contact with an etching target film. In Comparative Examples 1 and 3 described later, an etching gas containing a β-diketone and nitrogen monoxide (NO) was brought into contact with the etching target film, while in Comparative Examples 2 and 4 described later, an etching gas containing a β-diketone and oxygen ($O_2$) was brought into contact with the etching target film.

Example 1, Comparative Examples 1 and 2

Table 1 below shows the gas type, HFAc flow rate, gas flow rate, and etching rate in the etching described above.

The following explains how Comparative Examples 1 and 2 are different from Example 1. In Example 1, HFAc and $NO_2$ were supplied. In contrast, in Comparative Example 1, HFAc and NO were used, while in Comparative Example 2, HFAc and $O_2$ were used. The procedure was otherwise performed in the same manner as in Example 1, and the amount of etching and the compositional ratio of the gallium nitride (GaN) film were measured. Table 1 shows the results.

Example 2, Comparative Examples 3 and 4

The etching device 100 shown in FIG. 1 was used to etch a workpiece including a sapphire wafer and an etching target film made of an aluminum gallium nitride (AlGaN) film having a 1 cm×1 cm shape and a film thickness of 1.2 μm formed on the surface of the sapphire wafer.

The material of the etching target film, etching gas type, and flow rate were changed as shown in Table 1. The procedure was otherwise performed in the same manner as in Example 1, and the etching rate and compositional ratio of the etching target film were measured. Table 1 shows the results.

TABLE 1

| | Etching target film | Etching gas Type | Flow rate [sccm] | Type | Flow rate [sccm] | Etching rate [nm/min] | Compositional ratio (N/Ga) Before etching | After etching |
|---|---|---|---|---|---|---|---|---|
| Example 1 | GaN | HFAc | 10 | $NO_2$ | 5 | 0.41 | 0.92 | 0.91 |
| Comparative Example 1 | GaN | HFAc | 10 | NO | 5 | 0.00 | 0.92 | — |
| Comparative Example 2 | GaN | HFAc | 10 | $O_2$ | 5 | 0.26 | 0.92 | 0.76 |
| Example 2 | AlGaN | HFAc | 10 | $NO_2$ | 5 | 0.48 | 1.06 | 1.02 |
| Comparative Example 3 | AlGaN | HFAc | 10 | NO | 5 | 0.00 | 1.06 | — |
| Comparative Example 4 | AlGaN | HFAc | 10 | $O_2$ | 5 | 0.13 | 1.06 | 0.86 |

A comparison of Example 1 with Comparative Example 1 shows that the gas mixture of HFAc and NO (Comparative Example 1) cannot etch the GaN film, while the etching gas with HFAc and $NO_2$ (Example 1) can etch the GaN film. Also, a comparison of Example 1 with Comparative Example 2 shows that the gas mixture of HFAc and $NO_2$ (Example 1) etches at an etching rate of 0.41 nm/min, and the GaN film after etching has a compositional ratio (N/Ga) of 0.91, while the gas mixture of HFAc and $O_2$ (Comparative Example 2) etches at an etching rate of 0.26 nm/min, and the GaN film has a compositional ratio (N/Ga) of 0.76, demonstrating that adding $NO_2$ to HFAc increases the etching rate compared to using the gas mixture of HFAc and $O_2$ and can reduce a decrease in the N content of the etching target film.

A comparison of Example 2 with Comparative Example 3 shows that the gas mixture of HFAc and NO (Comparative Example 3) cannot etch the AlGaN film, while the etching gas with HFAc and $NO_2$ (Example 2) can etch the AlGaN film. Also, a comparison of Example 2 with Comparative Example 4 shows that the gas mixture of HFAc and $NO_2$ (Example 2) etches at an etching rate of 0.48 nm/min, and the AlGaN film after etching has a compositional ratio (N/Ga) of 1.02, while the gas mixture of HFAc and $O_2$ (Comparative Example 4) etches at an etching rate of 0.13 nm/min, and the compositional ratio (N/Ga) is 0.86, demonstrating that adding $NO_2$ to HFAc increases the etching rate compared to using the gas mixture of HFAc and $O_2$ and can reduce a decrease in the N content of the etching target film.

Next, the operation of Example 3 is described. In Example 3, etching was performed using a second dry etching method in which a first etching step including bringing an etching gas B containing $NO_2$ into contact with an etching target film and a second etching step including bringing an etching gas C containing a β-diketone into contact with the etching target film are repeated.

First, the inside of the processing vessel 110, the pipes 121 and 171, the pipe 142, the pipe 152, the pipe 162, and the liquid nitrogen trap 174 was evacuated to lower than 10 Pa. Subsequently, a workpiece 10 placed on the placement unit 111 was heated by the heating means 170 and a heater disposed within the placement unit 111.

After confirming that the temperature of the workpiece 10 had reached 350° C., a $NO_2$ gas from the $NO_2$ gas supply unit 150 was supplied to the pipe 152, and the $NO_2$ gas was introduced into the processing vessel 110 while controlling the pressure inside the processing vessel 110 to 4.0 kPa. The temperature of the workpiece was set to 350° C., and the flow rate of the etching gas B was set as follows: $NO_2$=5 sccm. The $NO_2$ gas was allowed to flow for two minutes for contact with the etching target film. Then, the introduction of the $NO_2$ gas was stopped, and the inside of the processing vessel 110 was evacuated to lower than 10 Pa.

Then, gaseous HFAc from the β-diketone supply unit 140 was supplied to the pipe 142, and the HFAc gas was allowed to flow into the processing vessel 110 while controlling the pressure inside the processing vessel 110 to 8.0 kPa. The temperature of the workpiece was set to 350° C., and the etching gas C flow rate was set as follows: HFAc=10 sccm. The HFAc gas was allowed to flow for two minutes for contact with the etching target film. Then, the introduction of the HFAc gas was stopped, and the inside of the processing vessel 110 was evacuated to lower than 10 Pa.

The operation including, as one cycle, introducing the $NO_2$ gas into the processing vessel 110 and introducing the HFAc gas into the processing vessel 110 was repeated 25 times (the number of cycles: 25). Subsequently, the inside of the processing vessel 110 was evacuated to lower than 10 Pa and purged with a $N_2$ gas supplied from the inert gas supply unit 160. The workpiece 10 was then taken out, and the amount of etching and the compositional ratio were evaluated.

Example 3

Table 2 below shows the $NO_2$ flow rate and HFAc flow rate per cycle, pressure in the processing vessel, temperature during etching, flow time, number of cycles, etching thickness, and compositional ratio before and after etching in the etching described above. The etching target film used was the same as that in Example 1.

Example 4

The etching device 100 shown in FIG. 1 was used to etch a workpiece including a sapphire wafer and an etching target film made of an aluminum gallium nitride (AlGaN) film having a 1 cm×1 cm shape and a film thickness of 1.2 μm formed on the surface of the sapphire wafer. The etching target film was changed to the same as in Example 2. The procedure was otherwise performed in the same manner as in Example 3, and the etching thickness and compositional ratio of the etching target film were measured. Table 2 shows the results.

TABLE 2

| | Etching target film | $NO_2$ etching conditions (one cycle) | | | | HFAc etching conditions (one cycle) | | | | Number of cycles | Etching thickness [nm] | Compositional ratio | |
|---|---|---|---|---|---|---|---|---|---|---|---|---|---|
| | | Flow rate [sccm] | Pressure [kPa] | Temp. [kPa] | Time [min] | Flow rate [sccm] | Pressure [kPa] | Temp. [° C.] | Time [min] | | | Before etching (N/Ga) | After etching |
| Example 3 | GaN | 5 | 4 | 350 | 2 | 10 | 8 | 350 | 2 | 25 | 14.7 | 0.92 | 0.94 |
| Example 4 | AlGaN | 5 | 4 | 350 | 2 | 10 | 8 | 350 | 2 | 25 | 7.0 | 1.06 | 1.05 |

A comparison of Example 3 with Example 1 shows that the GaN film can be etched in Example 3 using the second dry etching method for etching as in Example 1 using the first dry etching method for etching. Also, in Example 3, the compositional ratio (N/Ga) of the GaN film after etching is 0.94, demonstrating that the decrease in the N content can be reduced also in the second etching method.

A comparison of Example 4 with Example 2 shows that the AlGaN film can be etched in Example 4 using the second dry etching method for etching as in Example 2 using the first dry etching method for etching. Also, in Example 4, the compositional ratio (N/Ga) of the GaN film after etching is 1.05, demonstrating that the decrease in the N content can be reduced also in the second etching method.

The above results demonstrate that the use of HFAc and $NO_2$ as etching gases makes it possible to etch the GaN film or AlGaN film at a workpiece temperature of 350° C. or lower without decreasing the N content.

The present application claims priority under the Paris Convention and the law of the designated state to Japanese Patent Application No. 2021-075900 filed on Apr. 28, 2021, the entire contents of which are hereby incorporated by reference.

REFERENCE SIGNS LIST 10 workpiece
100 etching device
110 processing vessel
111 placement unit
121 pipe
140 β-diketone supply unit
141, 142 pipe
150 $NO_2$ gas supply unit
151, 152 pipe
160 inert gas supply unit
161, 162 pipe
170 heating means 171, 172 pipe
173 vacuum pump
174 liquid nitrogen trap
MFC1, MFC2, MFC3 mass flow controller
PI1, PI2 pressure gauge
V1, V2, V3, V4, V5, V6, V7, V8 valve

The invention claimed is:

1. A dry etching method, comprising:
bringing a β-diketone and $NO_2$ into contact with an etching target film for etching in a non-plasma state, the etching target film being formed on a surface of a workpiece and containing a nitride of a metal.

2. The dry etching method according to claim 1, wherein the etching target film is a nitride film of at least one group 13 metal selected from the group consisting of Ga, Al, and In.

3. The dry etching method according to claim 1, wherein the β-diketone is at least one compound selected from the group consisting of hexafluoroacetylacetone, trifluoroacetylacetone, and acetylacetone.

4. The dry etching method according to claim 1, wherein an etching gas A containing the β-diketone and $NO_2$ is brought into contact with the etching target film.

5. The dry etching method according to claim 4, wherein a temperature of the etching target film is 250° C. or higher and 400° C. or lower when the etching gas A is brought into contact with the etching target film.

6. The dry etching method according to claim 4, wherein a volume ratio of the β-diketone to the $NO_2$ in the etching gas A is β-diketone:$NO_2$=10:0.1 to 100.

7. The dry etching method according to claim 4, wherein a volume ratio of the β-diketone to the $NO_2$ in the etching gas A is β-diketone:$NO_2$=10:0.01 to 10.

8. The dry etching method according to claim 4, wherein a pressure in a processing vessel in which the workpiece with the etching target film formed thereon is placed is in a pressure range of 0.1 kPa to 101.3 kPa when the etching gas A is brought into contact with the etching target film.

9. The dry etching method according to claim 4, wherein the etching gas A further contains at least one inert gas selected from the group consisting of $N_2$, Ar, He, Ne, and Kr.

10. The dry etching method according to claim 1, comprising:
a first etching step comprising bringing an etching gas B containing the $NO_2$ into contact with the etching target film, and
a second etching step comprising bringing an etching gas C containing the β-diketone into contact with the etching target film.

11. The dry etching method according to claim 10, wherein the first etching step and the second etching step are repeated.

12. The dry etching method according to claim 10, wherein a temperature of the etching target film is 250° C. or higher and 400° C. or lower when the etching gas B is brought into contact with the etching target film and when the etching gas C is brought into contact with the etching target film.

13. The dry etching method according to claim 10, wherein a pressure in a processing vessel in which the workpiece with the etching target film formed thereon is placed is in a pressure range of 0.1 kPa to 101.3 kPa when the etching gas B is brought into contact with the etching target film and when the etching gas C is brought into contact with the etching target film.

14. The dry etching method according to claim 10, wherein the etching gas B and the etching gas C each further contain at least one inert gas selected from the group consisting of $N_2$, Ar, He, Ne, and Kr.

15. A semiconductor device production method, comprising:
allowing an etching target film containing a nitride of a metal on a substrate to react with a β-diketone and $NO_2$ for etching in a non-plasma state by the dry etching method according to claim 1.

* * * * *